United States Patent [19]

Stump et al.

[11] Patent Number: 4,534,695

[45] Date of Patent: Aug. 13, 1985

[54] WAFER TRANSPORT SYSTEM

[75] Inventors: Paul O. Stump, Byfield; Calvin G. Taylor, Andover, both of Mass.

[73] Assignee: Eaton Corporation, Cleveland, Ohio

[21] Appl. No.: 497,333

[22] Filed: May 23, 1983

[51] Int. Cl.³ .............................................. B65G 25/00
[52] U.S. Cl. .................................... 414/749; 414/225; 414/82; 198/775
[58] Field of Search ............... 414/222, 225, 749, 750, 414/751, 752, 416, 82, 85; 198/775

[56] References Cited

U.S. PATENT DOCUMENTS

| | | | |
|---|---|---|---|
| 3,645,581 | 2/1972 | Lasch, Jr. et al. | 414/752 X |
| 3,834,213 | 9/1974 | Henzler et al. | 414/225 X |
| 3,921,788 | 11/1975 | Roberson, Jr. et al. | 414/222 |
| 3,973,665 | 8/1976 | Giammanco | 198/775 |
| 4,361,413 | 11/1982 | Toda | 414/752 |
| 4,432,692 | 2/1984 | Breneman | 414/749 |

Primary Examiner—Terrance L. Siemens
Attorney, Agent, or Firm—C. H. Grace; F. M. Sajovec

[57] ABSTRACT

A transport apparatus (10) for moving semiconductor wafers (12) between a cassette (15) and a process station (16), and from the process station to another cassette (17). A horizontally movable input shuttle (20) has three wafer holding elements (30, 32, 34) formed thereon. In a first position of the shuttle the second and third holding elements overly a pair of vertically movable lift plates (60), and in a second position of the shuttle the first and second holding elements overly the lift plates. A lifting mechanism (28) at the process station lifts wafers off the input shuttle when the shuttle is in its second position and deposits them on an output shuttle (22) which is essentially identical to the input shuttle. Wafers are lifted off the holding elements by the lift plates whenever the shuttle reaches either position, after which the lift plates replace the wafers on the shuttle and the shuttle is again moved. In this manner, a succession of wafers are moved stepwise from one cassette to the process station, and then to the other cassette. In accordance with one aspect of the invention the shuttle and the lift plates undergo harmonic motion to minimize relative motion between the wafers and the shuttle and lift members due to inertia.

7 Claims, 7 Drawing Figures

WAFER TRANSPORT SYSTEM

The present invention relates to systems for transporting semiconductor wafers, and more specifically to a system for transporting wafers which are extremely hot.

In the processing of semiconductor wafers, special handling is required because the wafers are extremely fragile. There are several known systems used in transporting wafers, including gas bearing systems, belt systems, and walking beam systems. While these systems have proved to be very useful for general transport requirements, when wafers are transported through a processing station which heats each wafer to a very high temperature the known systems may not be suitable. For example, in an optical annealer relatively cool wafers are exposed to a high intensity lamp at an annealing station in which the wafers are rapidly heated to around 1000° C. After they are exposed the wafers are cooled at successive stations.

None of the known transport systems discussed above are considered to be suitable for the above process. An air bearing system subjects the bottom of the wafer to a flow of low pressure air or other gas, which can cause uneven cooling of the wafers. A resilient belt system is not adaptable for use in such a system because contact between an extremely hot wafer and a resilient belt can damage the belt, and more importantly, can cause contamination of the wafer. As in any wafer transport system, but more so in a system wherein hot wafers are handled, it is considered to be important that relative sliding movement between the wafer and the transport elements be minimized. In a walking beam system, there is inherently some relative movement when the wafers are transferred from one beam element to another.

It is thus an object of the present invention to provide a wafer transport system which is suitable for use in an in-line wafer processing system in which the wafers are heated.

Another object of the invention is to provide such a system which is suitable for use in a processing system in which the wafers are heated to a temperature approaching the melting point of silicon.

Another object of the invention is to provide a wafer transport system in which there is essentially no relative sliding motion between the wafers and elements of the transport system.

Another object of the invention is to provide such a system which provides gradual acceleration and deceleration of a wafer whenever it is started and stopped along a processing path.

Another object of the invention is to provide a wafer transport system which provides in-line, stepwise movement of the wafers to permit a plurality of operations to be carried out simultaneously within a single processing apparatus.

To meet the above objectives the present invention provides a transport system for moving wafers to and from a processing station which provides an input shuttle movable linearly along a horizontal path, an input lift mechanism capable of lifting wafers off the input shuttle, a lift mechanism at the processing station, an output shuttle movable linearly along a horizontal path, and an output lift mechanism capable of lifting wafers off the output shuttle.

Each shuttle includes three equally spaced wafer holding elements and is movable a linear distance equal to the spacing between the holding element. Each lift mechanism includes two lift elements spaced apart a distance equal to the spacing between the wafer holding elements, and the shuttle is movable between a first position in which the second and third wafer holding elements overlie the lift elements and a second position in which the first and second holding elements overlie the lift elements. In the first input shuttle position the first holding element is positioned to extract wafers one by one from a cassette. In the second input shuttle position the third holding element registers with the lift mechanism at the processing station, which is operable to lift wafers off the shuttle into a processing station.

After every movement of the shuttle to its second position the input and process lift mechanisms are raised to lift wafers off the shuttle while it moves back to its first position, after which the wafers are returned to the shuttle. In this manner the wafers can be transported one by one through successive positions in the processing station.

The output shuttle and lift mechanism operates similarly to the input mechanisms described above, except that wafers are extracted from the processing station and deposited in an output cassette.

Both the shuttle mechanism and the input and output lift mechanisms are operated by cam mechanisms which impart harmonic motion to them such that they accelerate slowly from rest, reach a maximum velocity at the midpoint of their travel, and then decelerate gradually back to rest. In this way relative motion between the wafers and the transport elements due to inertia is minimized.

Other objects and advantages will be apparent from the following description when considered in connection with the accompanying drawings, wherein.

Figure 1:
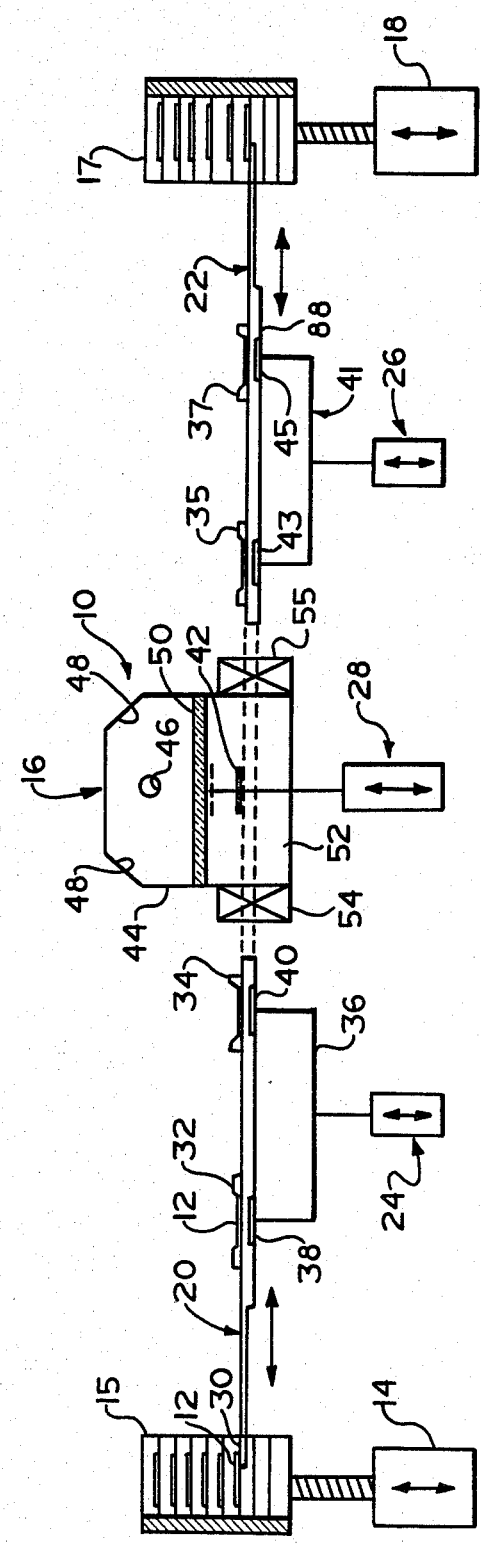
FIG. 1 is a schematic representation of the inventive system.

Referring to FIG. 1, there is schematically illustrated a wafer transport system 10 operable to transfer wafers 12 from a cassette 15 on an input elevator 14 to an annealing station 16, and from the annealing station to an output cassette 17 on an elevator 18.

The transport system comprises an input shuttle assembly 20, an output shuttle assembly 22, an input lift mechanism 24, and output lift mechanism 26, and a process station lift mechanism 28.

The input shuttle 20 comprises a first wafer holding element 30, a second wafer holding element 32, and a third wafer holding element 34, with the wafer holding elements being equally spaced along the shuttle. The shuttle is linearly movable between a first position shown in solid line and a second position shown in broken line, with the distance moved being equal to the distance between the wafer holding elements.

The input lift mechanism comprises a vertically movable table 36, including two wafer lift elements 38 and 40 spaced apart a distance which places them in alignment with the second and third wafer holding elements when the shuttle is in its solid line position. As will be described in more detail later, the lift elements 38 and 40 straddle the shuttle 20 so that when the lift table 36 is moved upward from the position shown, wafers which are on the wafer holding element will be lifted off the shuttle 20.

The process lift station lift mechanism 28 comprises a single lift table 42 which is particularly adapted to handle hot wafers at the annealing station 16, as will be described in further detail, and is movable vertically between the solid line position shown to the broken line position in which a wafer 12 is placed in position for processing. The lift table 42 is positioned along the wafer path a distance from the second lift element 40 which is equal to the travel of the shuttle so that when the shuttle is in the broken line position the lift table 42 is aligned with the third wafer holding element.

The cassette elevators 14 and 18 and the cassettes 15 and 17 are well-known, commercially available articles and will not be described in detail herein.

In operation, the elevator 14 is positioned so that a wafer 12 overlies the first wafer holding element 30, wherein the wafer is picked up by vacuum for transfer out of the cassette 15. The shuttle 20 is then moved to the right to its second, broken line position, which puts the wafer in a position overlying the first lift element 38. The lift table 36 is then raised, lifting the wafer off the shuttle, after which the shuttle is moved back to its solid line position to put the first wafer station in position to pick up another wafer from the cassette 15.

When the shuttle is returned to the solid line position, the table 36 is also returned to the solid line position, which places the first wafer onto the second wafer holding element 32 of the shuttle. The shuttle is then again moved to its broken line position, which puts the first wafer in a position overlying the second lift element 40 and the second wafer overlying the first lift element. The lift table is then raised again to lift both wafers off the shuttle while the shuttle is again returned to its solid line position to pick another wafer from the cassette. It can be appreciated that upon the next movement of the shuttle to its broken line position, the first wafer will be placed in a position overlying the process station lift table 42 within the annealing station 16. Once a wafer is in position in the annealing station the lift table 42 is raised to lift the wafer off the shuttle and into position for processing.

In the embodiment shown herein for illustration purposes the process to which the wafers are transported is an optical annealing process wherein the wafers are rapidly heated to a temperature which can be close to the melting point of silicon. The annealing station illustrated schematically in FIG. 1 comprises an enclosed housing 44 defining a process chamber, a lamp 46, reflectors 48 and a window 50 which defines the bottom of the process chamber. A sealed lower chamber 52 through which the wafers are transported includes an inlet valve 54, and an outlet valve 55 through which the wafers pass as they are transported through the system. Whenever the shuttle 20 moves to its broken line position, the inlet valve 54 opens to let the shuttle pass into the lower chamber, after which the lift table 42 is raised to position the wafer 12 adjacent the window 50.

The shuttle 20 is then moved back to its solid line position, the valve 54 is closed, and the lamp 46 is energized to initiate heating of the wafer. Because of the higher temperature to which the wafer is heated, the lift table 42 includes quartz pins which contact the wafer, as will be described later.

Once wafers occupy all three of the wafer holding elements of the shuttle 20, as described above, it can be appreciated that subsequent movements of the shuttle 20 and the lift assembly 24 will result in a continuous stepwise flow of wafers from the input cassette 15 to the annealing station 16.

The output shuttle 22 and the output lift assembly 26 are essentially identical to their input counterparts including a fourth wafer holding element 35, a fifth wafer holding element 37, a sixth wafer holding element 39, an output lift table 41, and output lift elements 43 and 45; and are operable to remove wafers from the annealing station and transport then to the output cassette 17 in the same stepwise manner, with the input and output shuttles and lift assemblies being coordinated so that the output shuttle 22 is in its solid line position when the input shuttle 20 is in its broken line position and vice versa. In the illustrative embodiment, the holding elements 35 and 37 also define cooling stations.

In the illustrative embodiment the annealing process takes about three seconds; therefore, the movements of the shuttles and lifts are timed to accomodate this cycle. It can be appreciated, however, that the basic elements of the inventive wafer transport are equally applicable to other wafer fabrication processes which will determine the precise timing of the stepwise movements.

Referring to FIGS. 2 to 7, the construction of the various elements of the illustrated transport system will be described in some detail, although certain elements are shown somewhat schematically in the interest of clarity. Since the input and output assemblies are essentially identical, certain elements will be described in relation to one or the other, it being understood that the description applies to both assemblies except where specifically noted.

Figure 2:
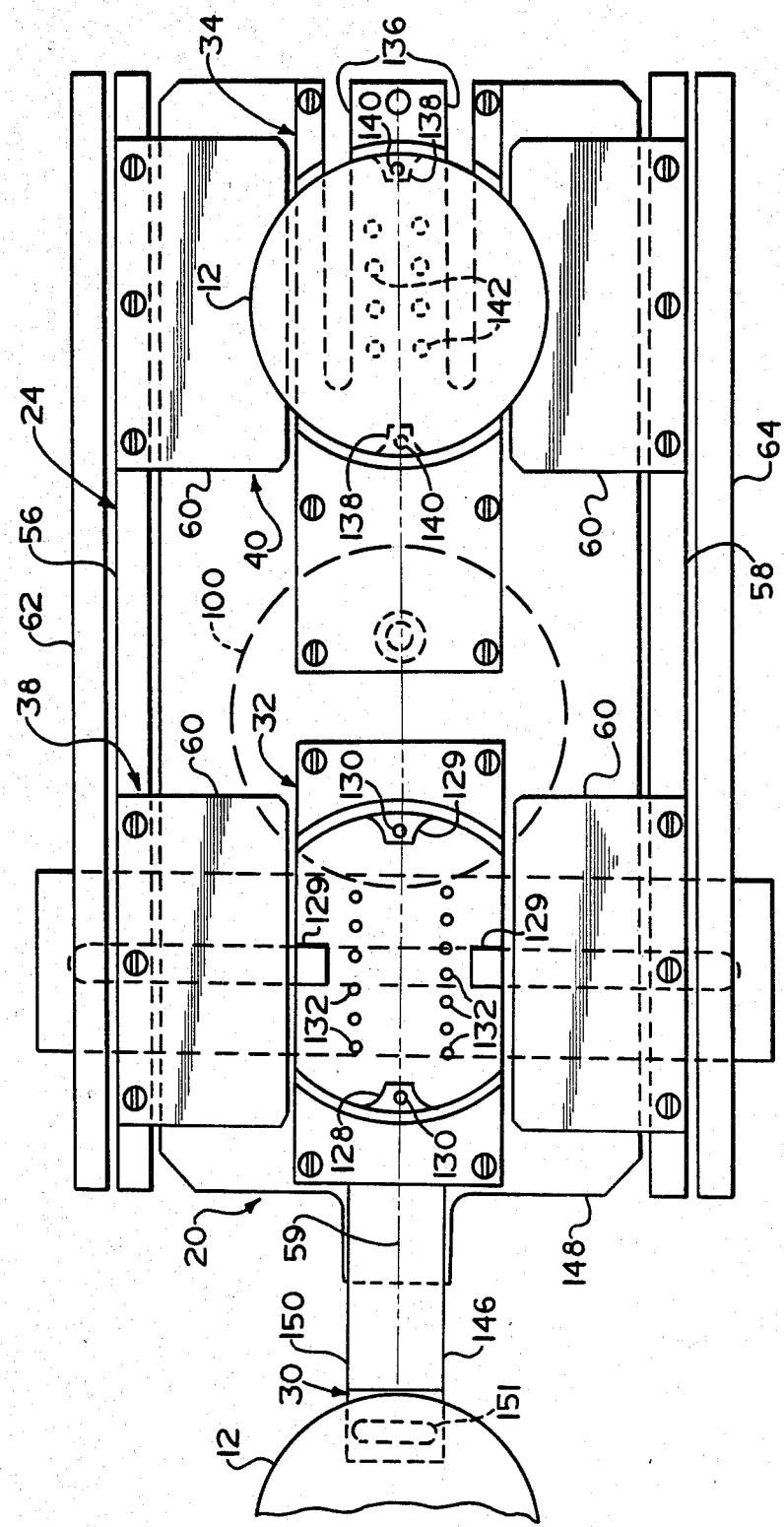
FIG. 2 is a plan view, of the input transport system of the invention.
Figure 3:
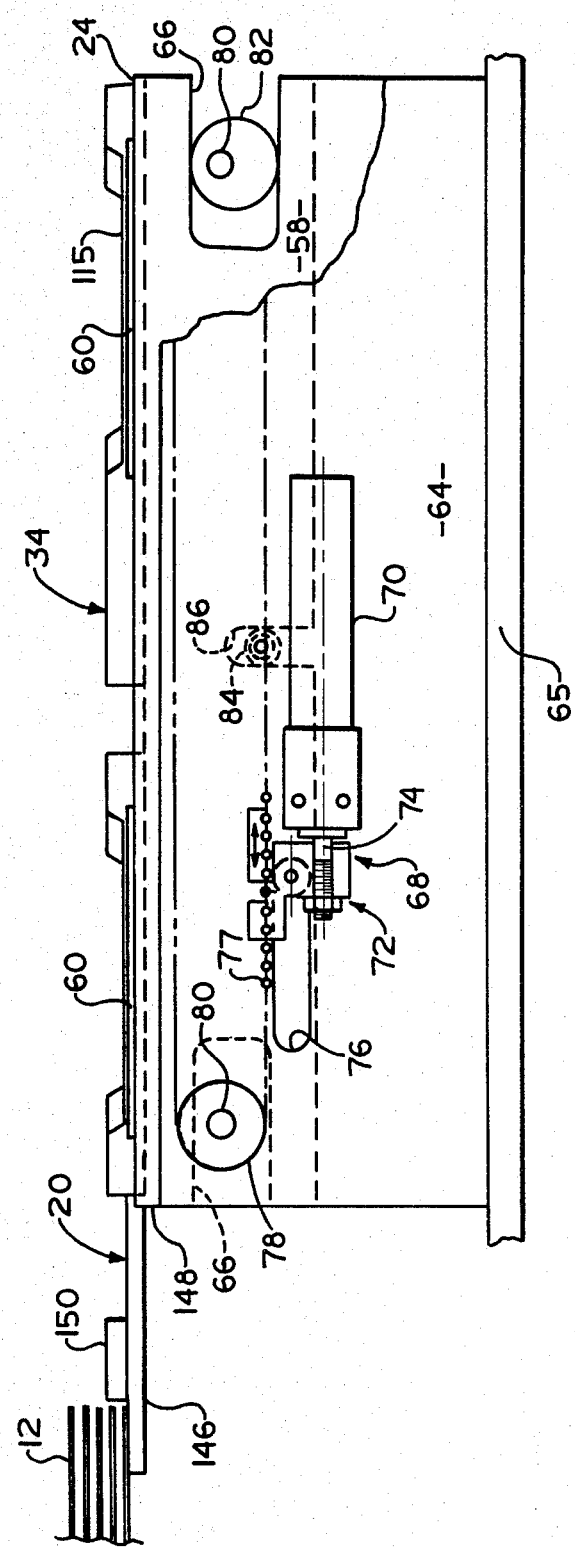
FIG. 3 is a side elevation view, with parts cut away, of the apparatus of FIG. 2.

Referring particularly to FIGS. 2 and 3, the input lift assembly 24 comprises a pair of side plates 56 and 58 spaced apart along the longitudinal centerline 59 of the apparatus and are connected together by stringers (not shown). Attached to the top surfaces of the side plates are four wafer lift plates 60, which define the lift elements 38 and 40, and are spaced apart about the centerline 59 in position to engage the edges of a wafer 12 received on the wafer holding elements 32 and 34. The side plates 56 and 58 are received between frame side plates 62 and 64 mounted on a base member 65 and include cam slots 66 formed in either end of both plates. The vertical movement of the lift mechanism is provided by a lift drive assembly 68 which comprises an air cylinder 70 attached to frame side plate 64, a slide assembly 72 attached to the piston rod 74 of the air cylinder and which is guided for movement within a slot 76 formed in plate 64. The slide mechanism drives a chain 77 reeved over a pair of sheaves 78 mounted on camshafts 80 extending perpendicular to the centerline 59 and received for rotation in the frame side plates 62 and 64. The camshafts include cam members 82 which are received in the cam slots 66. When the piston 74 is extended, the cams 82 rotate causing the lift assembly 24 to move upward. To guide the assembly for vertical movement only rollers 84 are mounted on shafts fixed to the frame side plates and are received in slots 86 formed in the lift assembly side plates 56 and 58.

Figure 4:
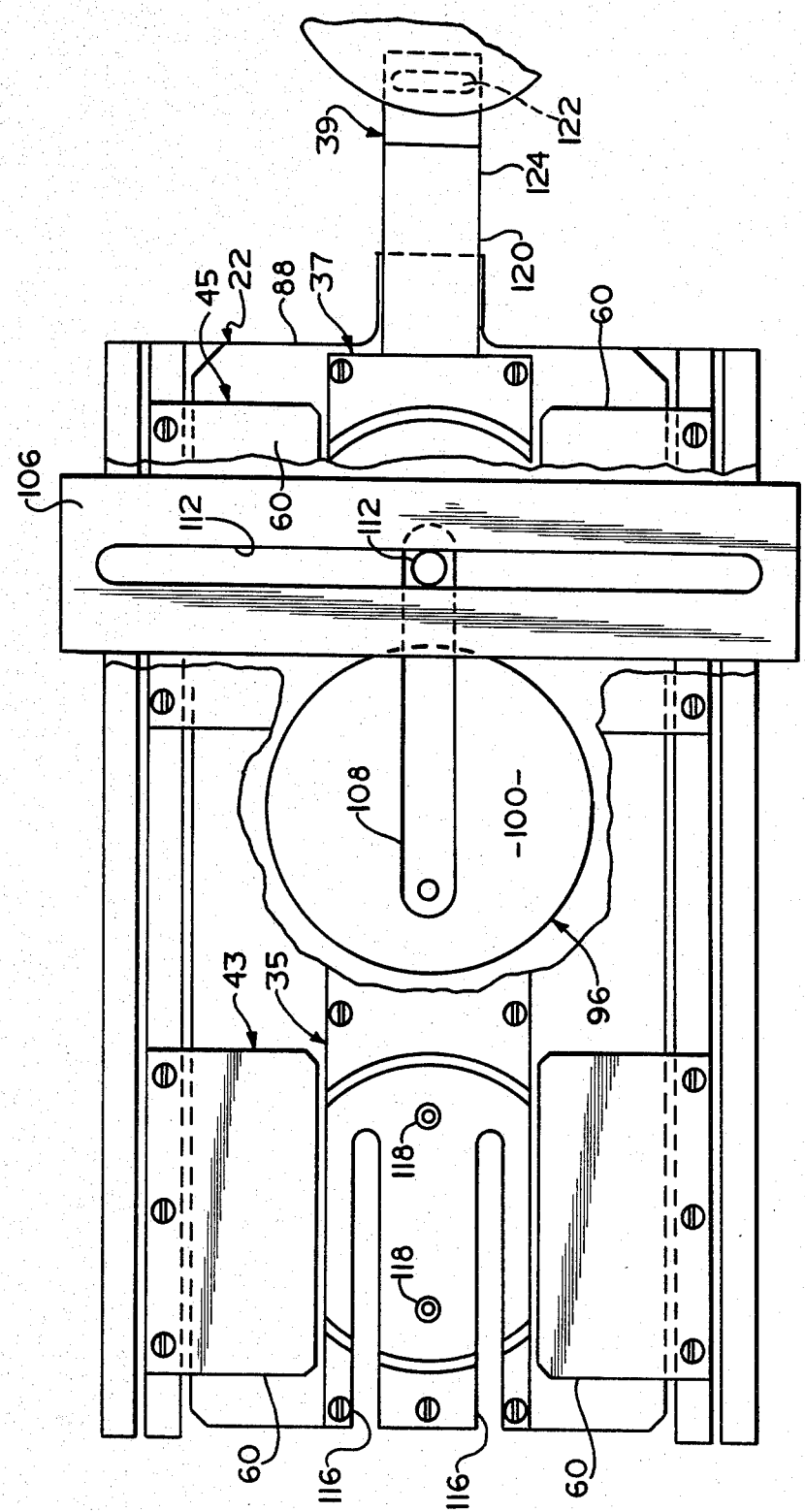
FIG. 4 is a plan view, with parts cut away, of the output transport system of the invention.
Figure 5:
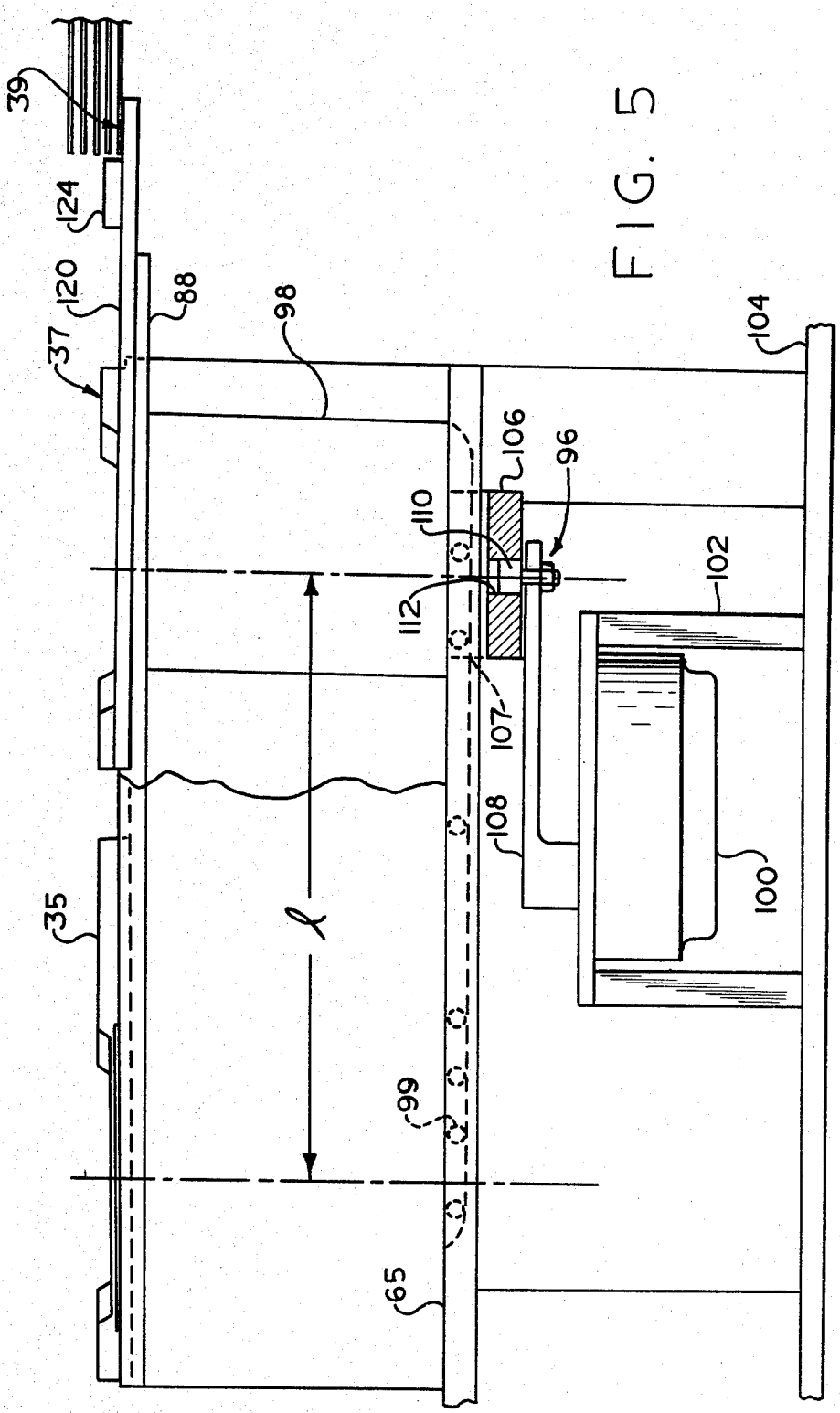
FIG. 5 is a side elevation view, with parts cut away, of the apparatus of FIG. 4.

FIGS. 4 and 5 illustrate the output side of the wafer transport system, and will be used to describe the shuttle mechanism.

The output shuttle 22 comprises a shuttle plate 88, the fourth wafer holding element 35 attached to the plate, the fifth wafer holding element 37 attached to the plate, the sixth wafer holding element 39, which is in the form of a vacuum chuck, and a drive assembly 96 which is operable to move the shuttle between the solid line and broken line positions of FIG. 1.

As shown in FIG. 5, the shuttle plate 88 is attached to a spacer member 98 which is received between the lift assembly side plates, and which is supported for horizontal movement on ball slides represented schematically at 99 received in the base member 65. Horizontal movement of the shuttle assembly is produced by a scotch yoke assembly comprising a gear motor 100 mounted on a bracket assembly 102 upstanding from a primary base plate 104, a yoke 106 attached to spacers 107 received through slots in the plate 65 and attached to the bottom of the spacer 98, and a drive arm 108 acting between the motor and the yoke. One end of the drive arm is fixed to the motor shaft, and the other end receives a roller 110 which rides in a slot 112 formed in the yoke. For each revolution of the motor the yoke mechanism will cause the shuttle to move a distance "1" corresponding to the spacing between the wafer holding elements.

Each of the wafer holding elements comprises an elongated member which is slightly narrower in width than the spacing between the lift plates 60 and is formed with a conical depression having a bottom surface 115 which is slightly higher than the upper surface of the lift plates.

In the illustrative embodiment, each of the holding elements is somewhat different depending on its position relative to the annealing process. Thus, as shown in FIG. 4, the fourth holding element 35 defines a cooling station and includes two slots 116, which also extend through the shuttle plate 88 in order to clear the quartz pins which lift the wafers in the process station, as will be described later. Since the wafers are extremely hot when they are deposited on the fourth holding element, the wafers are received on quartz tubes 118 which extend just above the bottom surface 115, and which communicate with a vacuum source to hold the wafers in place. The fifth holding element 37 also has vacuum ports (not shown) formed in the bottom surface 115; however, they are not necessarily defined by quartz tubes.

The sixth holding element 39 is defined by an extension 120 of the shuttle plate 88 which has a vacuum port 122 formed therein to retain a wafer which has been deposited thereon by the lift assembly 26. The element 39 is adapted to extend into the output cassette 17 to deposit a wafer therein in a known manner. In order to insure that the wafers are received completely within the cassette, a pusher plate 124 is attached to the extension 120 and is positioned to engage the edge of a wafer received over the vacuum port 122.

Referring again to FIGS. 2 and 3, the input shuttle 20 is essentially identical to the output shuttle, except for the specific structure of the wafer holding elements. The second holding element 32 includes raised bosses 128 and 129, extending upward from the bottom surface 115 of the conical depression, which receive the edges of the wafer. Vacuum ports 130 are formed in the bosses 128 to retain the wafer. In the illustrated embodiment a plurality of holes 132 are formed through the bottom surface 115 and communicate with a source of gas such as nitrogen to purge the wafer surface of air prior to the annealing step.

The third holding element 34 is similar to the fifth element 37, including clearance slots 136. The third holding element 34 includes raised bosses 138 with vacuum ports 140 formed therein, and gas holes 142 are also formed in the bottom surface 115.

The first wafer holding element 30 is essentially the same as the sixth element 39, including an extended portion 146 of a shuttle plate 148 and a pusher bar 150. On the input shuttle the pusher bar serves to prealign the wafers in the input cassette 15 prior to the application of vacuum to vacuum port 151.

Figure 6:
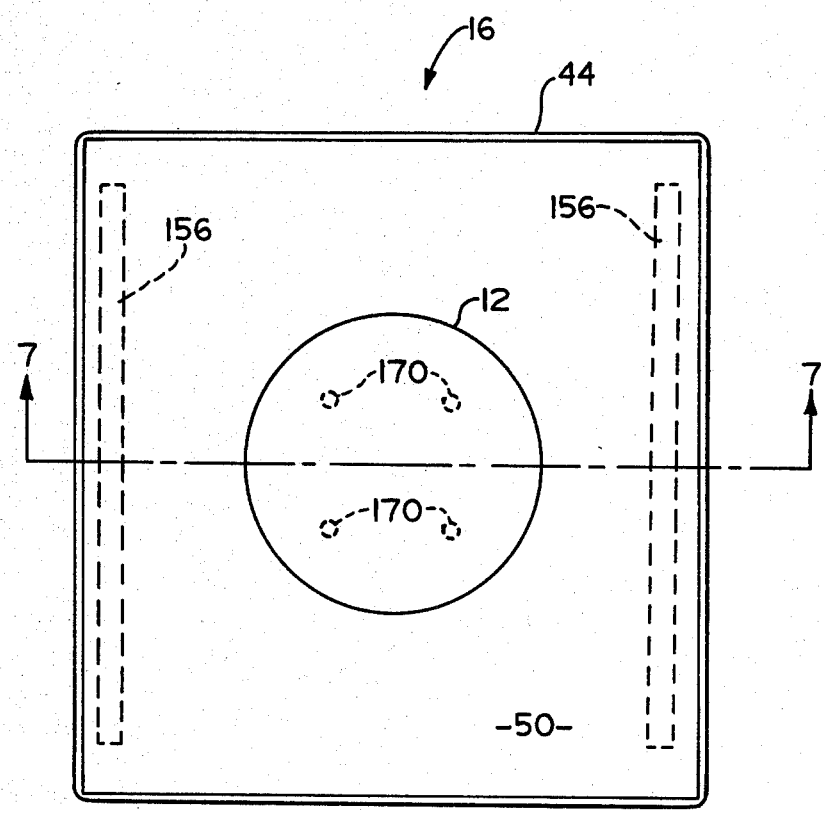
FIG. 6 is a plan view, with the upper portion removed, of a processing station operable with the invention.
Figure 7:
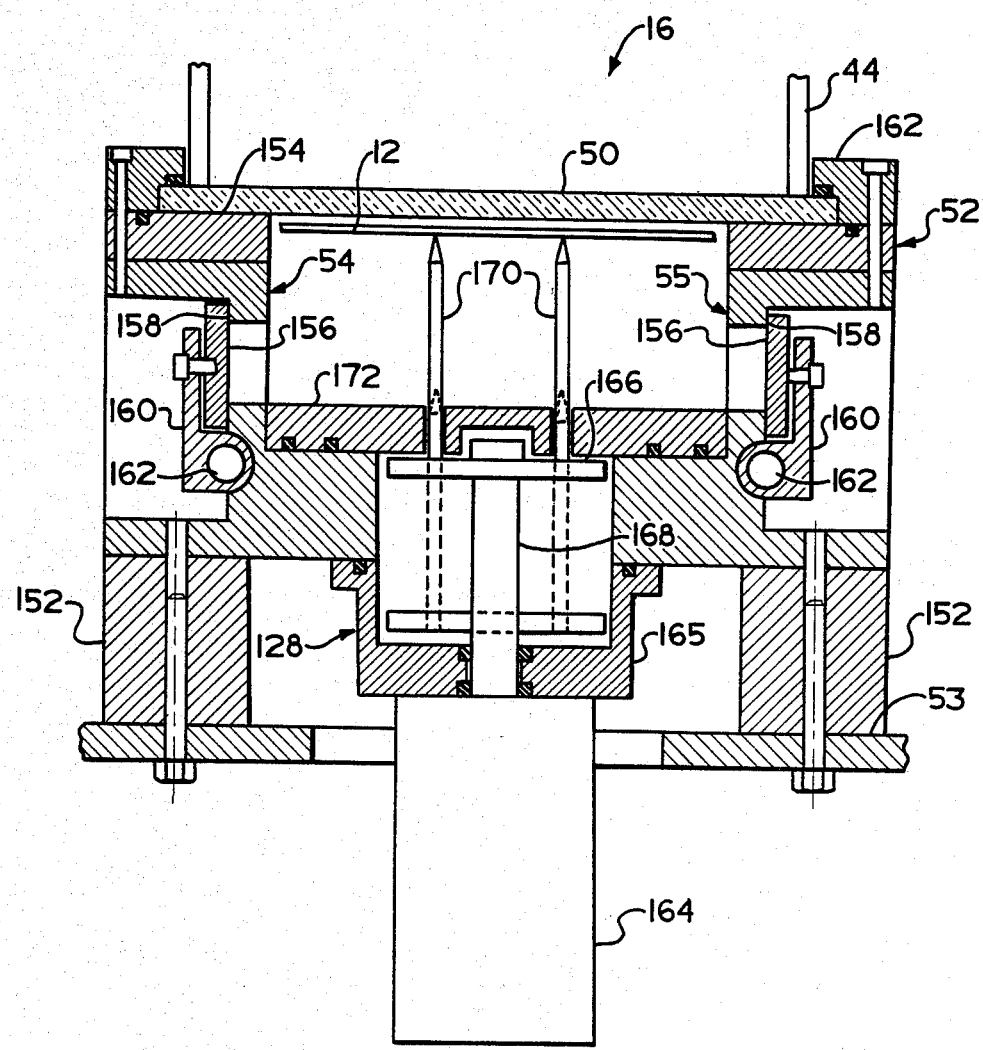
FIG. 7 is a sectional view taken along line 7—7 of FIG. 6.

As illustrated schematically in FIG. 1, the input and output apparatus are disposed on either side of a process station, which for illustative purposes herein is shown as an optical annealing station 16. Referring to FIGS. 6 and 7, there is illustrated a portion of an optical annealer 16, specifically the lower chamber 52 through which the wafers pass. In the apparatus shown herein the chamber comprises spacers 152 upstanding from the base member 53, input valve assembly 54, output valve assembly 55, a top plate 154 received over the valve assembly, the window 50 separating the lower chamber from the process chamber 44, and a retaining member 162 which holds the window to the top plate.

Each of the valve assemblies comprises an elongated valve member 156, sealingly engageable with an outer wall 158 of the valve assembly, and an actuating arm 160 to which the valve member is attached. The actuating arm is pivoted about a horizontal shaft 162, and is movable 90° between a closed position as shown and an open position by actuating means (not shown) which can be in the form of an air cylinder acting on an arm fixed to the shaft 162 in a known manner.

Centrally located within the lower chamber is the process station lift assembly 28 which is operable to lift wafers off the third holding element 34 when the input shuttle 20 is in its broken line position, and to deposit them on the fourth holding element 35 when the output shuttle 22 is in its broken line position. The lift assembly 28 comprises an air cylinder 164 mounted centrally within the chamber 52 beneath the valve assemblies on a cylindrical member 165, and a lift platform 166 attached to the piston rod 168 of the air cylinder. Wafers 12 are received on four pointed quartz rods 170 which are received in the lift platform. The quartz rods extend through holes formed in a cover plate 172 attached to the valve assemblies. The lift platform is movable between the broken line position shown in FIG. 7, in which the plane defined by the points of the quartz rods is just below the plane defined by the wafer-receiving surfaces of the holding members pads, and the solid line position in which the wafers are elevated to a position adjacent the window 50 for exposure by the lamp 46.

Since the shuttles 20 and 22 are moved by scotch yoke mechanisms, the shuttles undergo harmonic motion in moving between the solid and broken line positions of FIG. 1, such that each shuttle accelerates gradually from rest to a maximum velocity and then decelerates gradually to rest, as decribed above. Likewise the cam actuation of the lift assemblies 24 and 26 imparts similar motion thereto.

The wafer pusher 150 at the first holding element 30 initially allows a wafer to be precisely positioned on the holding element, whereupon vacuum is applied to port 151 to hold it in that position. Thereafter, the conical surfaces of the second, third, fourth and fifth holding elements 32, 34, 35 and 37 allow the wafers to become centered within each of the holding elements, while vacuum is applied to the wafers to essentially maintain the orientation of a wafer throughout the process.

We claim:

1. In apparatus for processing semiconductor wafers; a wafer transport system comprising a first horizontally movable shuttle having first, second and third wafer holding elements formed thereon in equally spaced relation to one another; a first vertically movable lift mechanism underlying said first shuttle, said lift mechanism including first and second wafer engaging surfaces formed thereon and spaced apart an amount equal to the spacing between the first and second and second and third wafer holding elements; means for moving said shuttle along a linear path between a first position wherein said first and second wafer holding elements are in vertical alignment with said first and second wafer engaging surfaces and a second position wherein said second and third wafer holding elements are in vertical alignment with said first and second wafer engaging surfaces, said moving means being operable to move said shuttle at a velocity which increases gradually from zero to a maximum midway between said first and second positions and which decreases gradually to zero during the remaining travel; and means for moving said lift mechanism vertically between a first position beneath the wafer holding elements formed on said first shuttle and a second position wherein said wafer engaging surfaces are operable to lift wafers free of said wafer holding elements, said moving means being operable to move said lift mechanism at a velocity which increases gradually from zero to a maximum midway between said first and second positions and which decreases gradually to zero during the remaining travel.

2. Apparatus as claimed in claim 1, including in combination, a processing station including vertically movable wafer receiving means underlying the path of said shuttle and in alignment with the third wafer holding element on said shuttle when the shuttle is in its first position, and means moving said wafer receiving means between a first position beneath said third wafer holding element and a second position wherein said wafer receiving means is operable to lift a wafer free of said third wafer holding element.

3. Apparatus as claimed in claim 2 in which said processing station includes heating means, said wafer recieving means including a plurality of quartz wafer contacting elements, said wafer contacting elements making substantially point contact with a wafer placed thereon.

4. Apparatus as claimed in claim 1, including first port means formed in said first, second and third wafer holding elements; a vacuum source; and means connecting said first port means to said vacuum source.

5. Apparatus as claimed in claim 1, including second port means formed in one or more of said wafer holding elements a source of pressurized gas, and means conecting said second port means to said source of pressurized gas.

6. Apparatus as claimed in claim 1, in which said shuttle comprises an elongated horizontal first plate on which said wafer holding elements are received, said horizontal first plate being somewhat narrower than a wafer received thereon; and said means for moving said shuttle comprises a second horizontal plate attached to said first plate perpendicularly thereto, an elongated slot formed in said plate, rotary drive means including an output shaft rotating about a vertical axis, and a crank arm connected at one end to said output shaft, the other end of said crank arm including bearing means received in said slot.

7. Apparatus as claimed in claim 6, in which said lift mechanism comprises a pair of upstanding elongated plate members received on opposite sides of said horizontal first plate, and first and second pairs of inwardly directed leaf members attached to said upstanding plate members in position to engage the undersides of wafers received on said wafer holding elements; and said means for moving said lift mechanism comprises horizontally disposed slots formed in said upstanding plate members, and eccentric drive cams received for rotation within said slots.

* * * * *